(12) United States Patent
Hsu et al.

(10) Patent No.: US 12,720,787 B1
(45) Date of Patent: Aug. 25, 2026

(54) TRANSISTOR COMPRISING A UNIFORM STACK OF CHANNEL MATERIAL LAYERS

(71) Applicant: Intel Corporation, Santa Clara, CA (US)

(72) Inventors: William Hsu, Portland, OR (US); Daniel Schulman, Hillsboro, OR (US); Sabih Omar, Hillsboro, OR (US); Vivek Thirtha, Portland, OR (US); Michael Babb, Portland, OR (US); Chen-Yi Su, Portland, OR (US); Brian Greene, Portland, OR (US); Chung-Hsun Lin, Portland, OR (US); Oleg Golonzka, Beaverton, OR (US); Kevin Fischer, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 571 days.

(21) Appl. No.: 18/129,695

(22) Filed: Mar. 31, 2023

(51) Int. Cl.
*H10D 30/43* (2025.01)
*H10D 30/01* (2025.01)
(Continued)

(52) U.S. Cl.
CPC ........... *H10D 30/43* (2025.01); *H10D 30/014* (2025.01); *H10D 30/6735* (2025.01);
(Continued)

(58) Field of Classification Search
CPC .. H10D 30/43; H10D 30/014; H10D 30/6735; H10D 62/121; H10D 64/021; H10D 64/258
See application file for complete search history.

(56) References Cited

U.S. PATENT DOCUMENTS

2018/0197784 A1 7/2018 Cheng et al.
2019/0157420 A1 5/2019 Cheng et al.
(Continued)

FOREIGN PATENT DOCUMENTS

TW 201606853 A 2/2016

OTHER PUBLICATIONS

Final Office Action from U.S. Appl. No. 16/914,145 notified Jul. 1, 2024, 19 pgs.
(Continued)

*Primary Examiner* — Mohammad A Rahman
(74) *Attorney, Agent, or Firm* — Essential Patents Group, LLP

(57) ABSTRACT

Transistor structures comprising a stack of channel material layers may be fabricated from a material stack comprising an uppermost sacrificial material layer over one or more bilayers. Each bilayer includes a sacrificial material layer and a channel material layer. The uppermost sacrificial material layer may ensure an uppermost channel material layer will have substantially the same structure as an underlying channel material layer. A channel portion of all channel material layers may therefore have substantially the same thickness. End portions of all channel material layers may therefore also be both above and below a first gate spacer with a second gate spacer adjacent to a sidewall of the end portions. A channel portion of an underlying one of the channel material layers may have a lesser thickness than that of its end portions. An uppermost channel material layer may advantageously have substantially the same difference in layer thickness between end portions and channel portion.

16 Claims, 6 Drawing Sheets

(51) Int. Cl.

| | |
|---|---|
| ***H10D 30/67*** | (2025.01) |
| ***H10D 62/10*** | (2025.01) |
| ***H10D 64/01*** | (2025.01) |
| ***H10D 64/23*** | (2025.01) |

(52) U.S. Cl.
CPC ......... *H10D 62/121* (2025.01); *H10D 64/021* (2025.01); *H10D 64/258* (2025.01)

(56) References Cited

U.S. PATENT DOCUMENTS

| | | | | |
|---|---|---|---|---|
| 2019/0378911 | A1 | 12/2019 | Lee et al. | |
| 2020/0044087 | A1* | 2/2020 | Guha ................. | H10D 30/6217 |
| 2020/0357911 | A1 | 11/2020 | Frougier et al. | |
| 2021/0305408 | A1 | 9/2021 | Yu et al. | |
| 2021/0408289 | A1 | 12/2021 | Guha et al. | |

OTHER PUBLICATIONS

Final Office Action from U.S. Appl. No. 16/914,145 notified Jul. 7, 2025, 18 pgs.
Non-Final Office Action from U.S. Appl. No. 16/914,145 notified Dec. 20, 2024, 15 pgs.
Non-Final Office Action from U.S. Appl. No. 16/914,145 notified Nov. 8, 2023, 16 pgs.
Notice of Allowance from U.S. Appl. No. 16/914,145 notified Nov. 5, 2025, 12 pgs.

* cited by examiner

TRANSISTOR COMPRISING A UNIFORM STACK OF CHANNEL MATERIAL LAYERS

BACKGROUND

Demand for higher performance integrated circuits (ICs) in electronic device applications has motivated increasingly dense transistor architectures. Stacked gate-all-around (GAA) transistor structures, for example comprising ribbons or wires (RoW) of channel material, include a plurality of channel material layers that are in a vertical stack with one channel material layer over another.

For stacked GAA transistor structures, it is often desirable to maximize the number channel material layers within a stack. However, doing so may induce more channel material layer variation within each stacked structure as it can be challenging to fabricate a top channel material layers that has a geometry substantially the same as an underlying channel material layer. For example, any of thickness, length, capacitance, etc. may differ across channel material layers within one stack. Such variation can result in a stacked transistor structure with compromised electrical performance.

Fabrication techniques and transistor architectures that improve uniformity of channel material layers within a stack are therefore commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
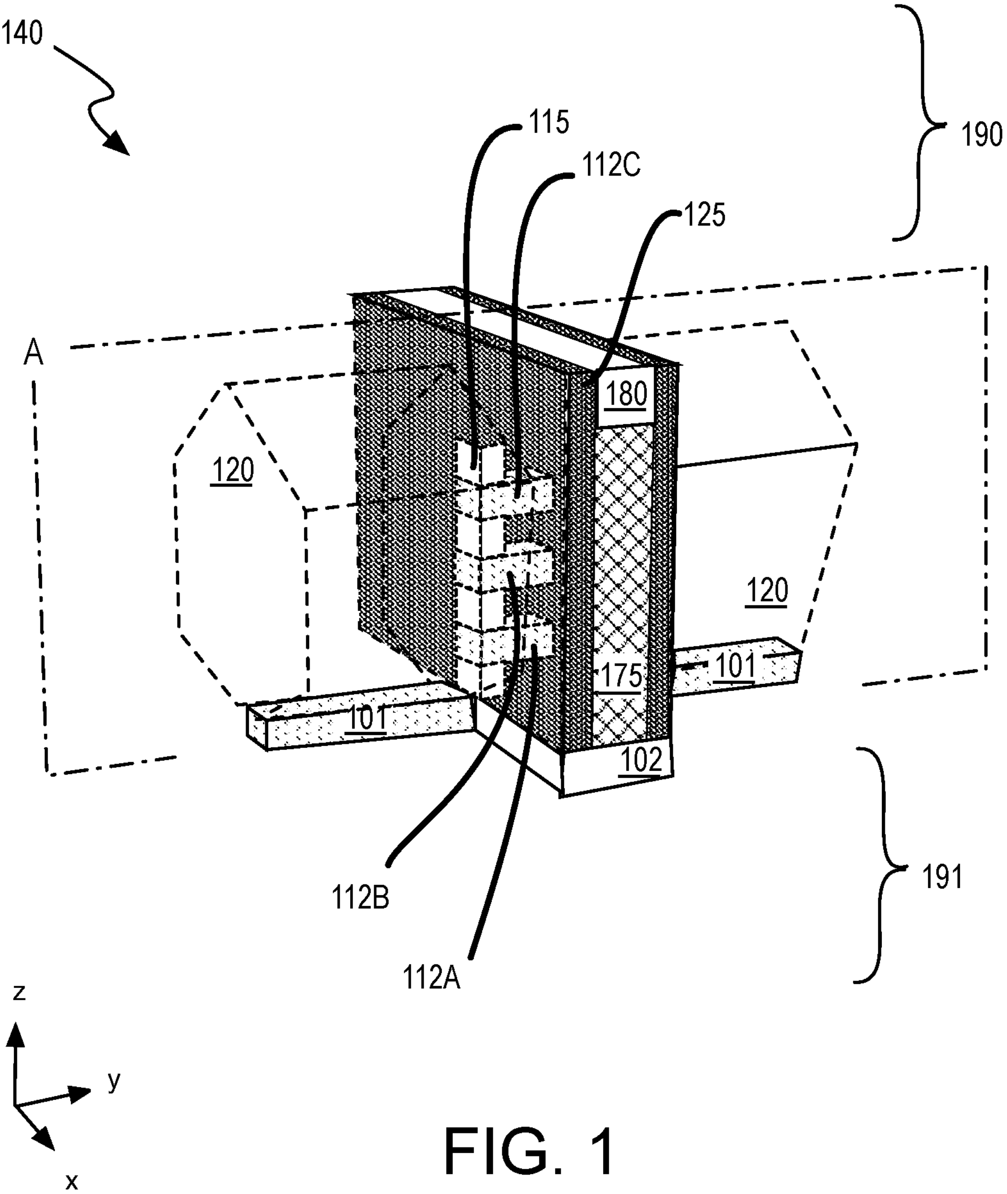
FIG. 1 is an isometric diagram of a transistor structure having a uniform stack of channel material layers, in accordance with some embodiments.

Embodiments are described with reference to the enclosed figures. While specific configurations and arrangements are depicted and discussed in detail, this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

In accordance with embodiments herein, integrated circuitry includes a transistor structure comprising a stack of uniform channel material layers. FIG. 1 is an isometric diagram of a transistor structure 140 comprising a stack of channel material layers 112A, 112B, and 112C, in accordance with some embodiments.

Transistor structure 140 has a GAA transistor architecture with a plurality of stacked channel material layers. Transistor structure 140 is illustrated as including three channel material layers 112A-112C, which comprise channel portions of transistor structure 140 that are surround by a gate stack including gate electrode material 175. A stacked transistor structure may however include any integer number n of two or more channel material layers (e.g., 2, 3, 4, 5 . . . 10 . . . 20, etc.) as embodiments herein are not limited in this respect. This population of n channel material layers may be conveniently grouped into an uppermost channel material layer and n-1 underlying channel material layers. Material layer 112C is the uppermost channel material layer of transistor structure 140 while material layers 112A and 112B are both underlying channel material layers of transistor structure 140.

Transistor structure 140 may be operable as a single metal-oxide-semiconductor field effect transistor (MOSFET) where all channel material layers 112A-112C are operable concurrently in electrical parallel. However, transistor structure 140 may also be operable as a plurality of transistors, for example where channel material layers 112A-112C each have at least different threshold voltages. Channel material layers 112A, 112B and 112C may each be part of a P-type transistor structure, an N-type transistor structure, or complementary MOS (CMOS) transistor structure that includes both P-type and N-type portions. In some exemplary embodiments, channel material layers 112A-112C are all portions of a P-type transistor structure. In other exemplary embodiments, channel material layers 112A-112C are all portions of an N-type transistor structure. In other embodiments, one of channel material layers 112A-112C is a portion of a P-type transistor structure while one of channel material layers 112A-112C is a portion of an N-type transistor structure Channel material layers 112A-112C are over a subfin material 101, which may have been part of a workpiece substrate, such as a large format semiconductor wafer, for example. An integrated circuit including transistor structure 140 may include any number of front-side metallization levels 190 over a "top" or "front" side of transistor structure 140, for example. Front-side metallization levels 190 may have any known structure, and any number of levels may interconnect one or more terminals of transistor structure 140 with other nodes of a circuit. An integrated circuit including transistor structure 140 may also include any number of back-side metallization levels 191 over a "bottom" or "back" side of transistor structure 140. Back-side metallization levels 191 may also have any known structure, and any number of levels may interconnect one or more terminals of transistor 140 with other nodes of a circuit (e.g., a power rail). In reference to substrate 101 and/or front-side metallization levels 190 and back-side metallization levels 191, underlying channel material layers 112A-112B may be referred to herein as comprising "lower" or "underlying" channel regions or portions, while the uppermost channel material layer 112C comprises an uppermost channel region or portion of transistor structure 140. Hence, inversion the transistor structure 140 does not alter the designation of uppermost and underlying channel material layers as employed herein.

A source and drain material 120 is coupled to opposite ends of the channel material layers 112A-112C. Source and drain material 120 is electrically coupled together through channel portions of channel material layers 112A-112C that are controllable by the field effect according to a voltage applied to gate electrode material 175. Each of channel material layers 112A-112C may be operable to contribute to a total drive current of transistor structure 140. Source and drain material 120 may be P-type or N-type material. In the illustrated example, source and drain material 120 comprises faceted epitaxial material that has been grown, for example laterally from end portions of channel material layers 112A-112C. Source and drain material 120 need not be epitaxial material, in which case the facets depicted in dashed line may not be present. Source and drain material 120 also need not be merged into a unitary body, in which case cantilevered source/drain nanowire ends may be individually contacted by a terminal contact metal (not depicted). Front-side metallization levels 190 may include a source and/or drain metallization that is in contact with source and drain material 120. Back-side metallization levels 191 may also include a source and/or drain metallization that is in contact with source and drain material 120. Likewise, either front-side metallization levels 190 or back-side metallization levels 191 may further include a contact (not depicted) to gate electrode material 175.

Gate electrode material 175 may comprise one or more materials, such as a workfunction material and a fill material. In exemplary embodiments, gate electrode material 175 includes at least a workfunction metal. In some embodiments, gate electrode material 175 comprises an n-type workfunction metal, which may have a workfunction between about 3.9 eV and about 4.2 eV, for example. Suitable n-type work function metals include, but are not limited to, hafnium, zirconium, titanium, tantalum, aluminum, and metal carbides that include these elements (e.g., titanium carbide, zirconium carbide, tantalum carbide, hafnium carbide and aluminum carbide). In some other embodiments, gate electrode material 175 comprises a p-type workfunction metal, which may have a workfunction between about 4.9 eV and about 5.2 eV, for example. Suitable p-type materials include, but are not limited to, ruthenium, palladium, platinum, cobalt, nickel titanium, tungsten, conductive metal nitrides (e.g., TiN, WN), and conductive metal oxides (e.g., ruthenium oxide). In still other embodiments, gate electrode material 175 may comprise a mid-gap workfunction metal having a workfunction between those of n-type and p-type workfunction metals (e.g., 4.2-4.9 eV).

An intervening gate spacer material 115 is between gate electrode material 175 and source and drain material 120. As illustrated, gate spacer material 115 is above and below each and every one of channel material layers 112A-112C. Another intervening gate spacer material 125 is between gate electrode material 175 and source and drain material 120. Gate spacer material 125 wraps around an outer sidewall of channel material layers 112A-112C. Gate spacer material 115 is therefore embedded within cavities of gate spacer material 125 and may therefore be referred to herein as a gate "cavity" spacer material 115.

Transistor structure 140 may further include additional materials. In the illustrated example, an isolation dielectric material 102 is adjacent to subfin material 101 and under gate electrode material 175 where gate electrode material 175 extends (e.g., in x-dimension) laterally beyond channel material layers 112A-112C. A mask material 180 is over gate electrode material 175, and may also be a dielectric material. Other materials (not depicted) may further surround source and drain material 120, etc. and be similarly considered portions of transistor structure 140.

Figure 2:
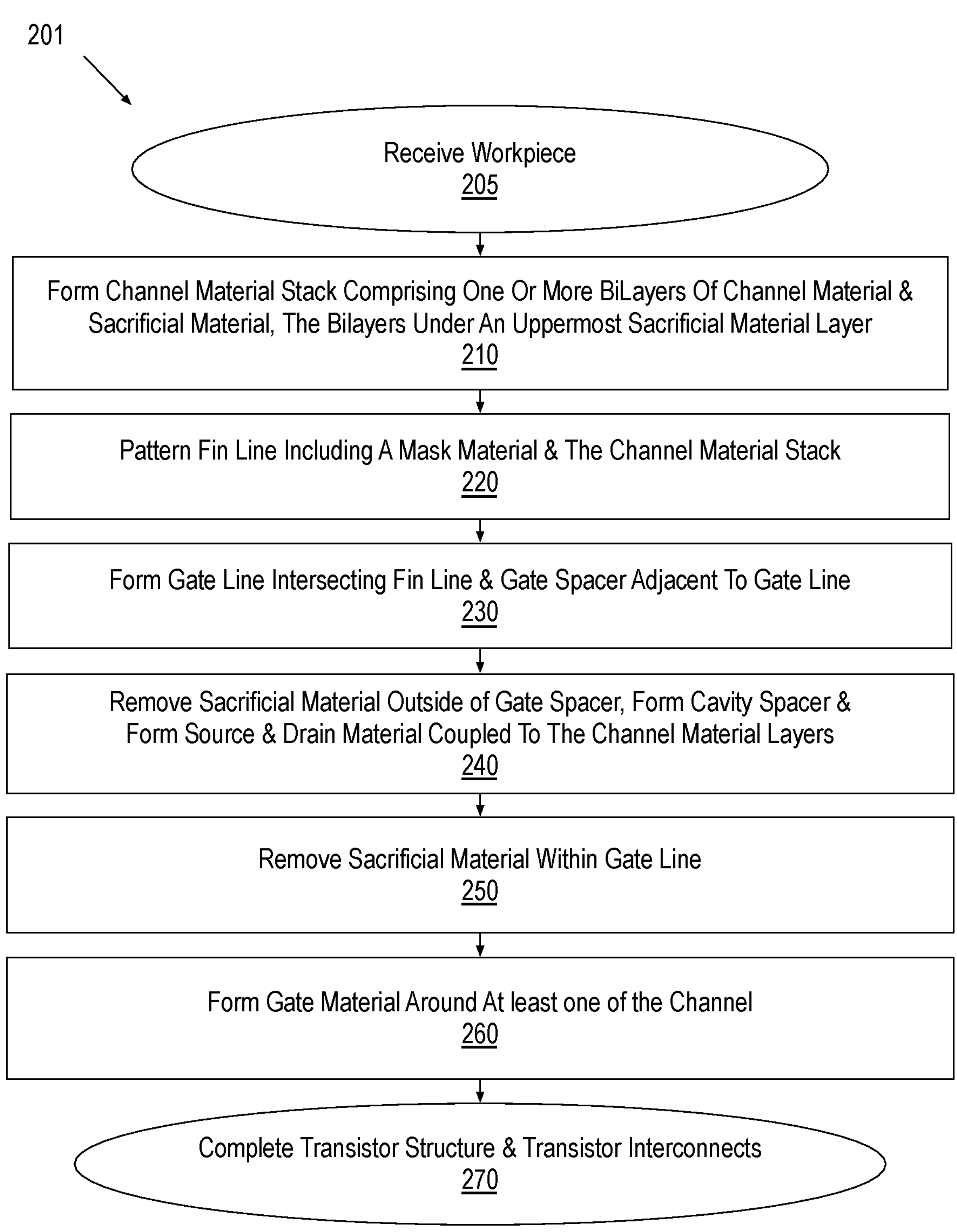
FIG. 2 is a flow diagram illustrating a method of fabricating a transistor structure having a uniform stack of channel material layers, in accordance with some embodiments.

FIG. 2 is a flow diagram illustrating methods 201 for fabricating a transistor structure having a stack of uniform channel material layers, in accordance with some embodiments. Methods 201 may be practiced to fabricate transistor structure 140 (FIG. 1), for example. FIG. 3A-3D are cross-sectional views of transistor structure 140 evolving as the methods 201 are practiced, in accordance with some embodiments. The cross-sectional views in FIG. 3A-3D are within the plane "A" depicted in FIG. 1, which is a "gate-cut" plane (in the y-z dimensions) that passes through a transverse width of gate electrode material 175 and through a longitudinal length of channel material layers 112A-112C. The transistor structures depicted in FIG. 3A-3D further highlight structural features associated with an exemplary practice of methods 201. However, the practice of methods 201 need not result in all the structures illustrated in FIG. 3A-3D.

In reference to FIG. 2, methods 201 begin at input 205 with receipt of a workpiece. In some examples, the workpiece received at input 205 comprises a 300-450 mm diameter wafer. The workpiece may include a substantially monocrystalline material, such as silicon, for example. Methods 201 continue at block 210 where a channel material stack is formed upon a front side of the workpiece, for example with any epitaxially growth processes suitable for forming a superlattice comprising material layers of desired compositions. In exemplary embodiments, the channel material stack formed at block 210 comprises an uppermost sacrificial material layer that is over one or more bilayers. Each bilayer with the stack further includes a channel material layer and a sacrificial material layer. At block 220, a mask material is formed over the channel material stack and the epitaxial material layers are patterned into a line, or fin, that includes the channel material stack and any overlying mask material(s). The patterned line or fin may extend any length along a first dimension and have any width in a second, orthogonal dimension. Any lithographic masking process and material etch process(es) may be practiced at block 220.

Figure 3A:
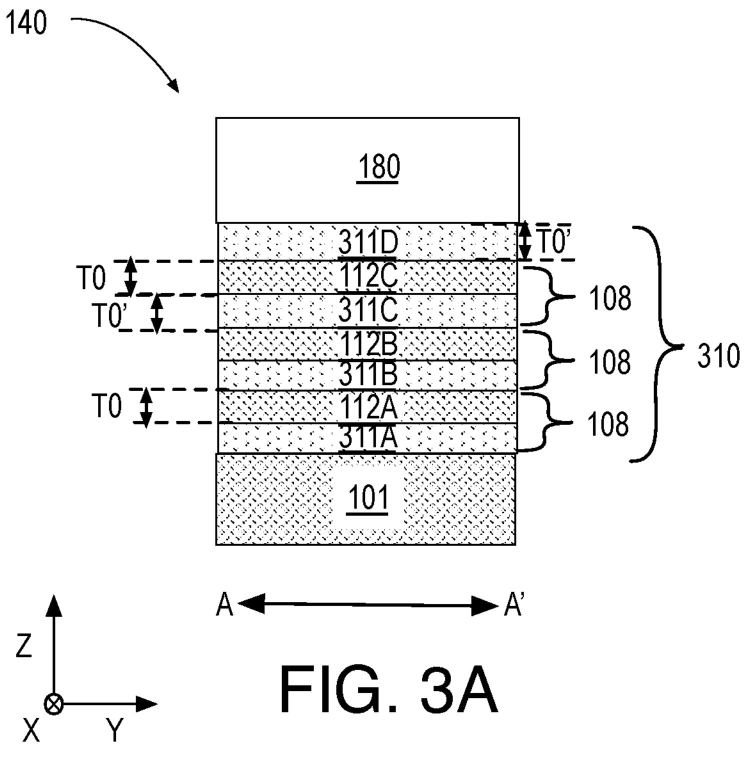
FIGS. 3A, 3B, 3C and 3D are cross-sectional views of a transistor structure evolving as the methods illustrated in FIG. 1 are practiced, in accordance with some embodiments.

In the example further illustrated in FIG. 3A, transistor structure 140 includes a channel material stack 310 over subfin material 101. A mask material 180 is over channel material stack 310. Both mask material 180 and channel material stack 310 has been patterned into a line or fin with some longitudinal length in the y-dimension and a transverse width in the x-dimension (e.g., into the page). In the illustrated example, channel material stack 310 includes three bilayers 108. However, the number of bilayers 108 may vary with implementation.

Each bilayer 108 includes a channel material layer 112A, 112B and 112C that has been patterned into a ribbon or wire structure. Channel material layers 112A-112C have an as-deposited thickness TO. In exemplary embodiments, TO is substantially equal across all of channel material layers 112A-112C. Although thickness TO may vary with implementation, in some examples thickness TO is 5-10 nm. Each bilayer 108 further includes a sacrificial material layer 311A, 311B and 311C that has been similarly patterned into a ribbon or wire structure. Sacrificial material layers 311A-311C have an as-deposited thickness TO' sufficient to facilitate subsequent formation of a gate stack under channel material layers 112A, 112B and 112C, respectively. As shown, channel material stack 310 further includes an uppermost sacrificial material layer 311D located between mask material 180 and the uppermost bilayer 108. Uppermost sacrificial material layer 311D has an as-deposited thickness TO', which in some embodiments is substantially equal to thickness TO' of underlying sacrificial material layers 311A-311C. In alternative embodiments, thickness TO' for uppermost sacrificial material layer 311D is different than thickness TO' of underlying sacrificial material layers 311A-311C. For example, TO' for uppermost sacrificial material layer 311D may be less than thickness TO' of underlying sacrificial material layers 311A-311C.

Uppermost sacrificial material layer 311D increases the total thickness of channel material stack 310, the associated growth time, as well as the aspect ratio of a stack of ribbon or wire structures patterned from channel material stack 310. However, as described further below, the inventors have found inclusion of uppermost sacrificial material layer 311D over bilayers 108 advantageously improves the uniformity of the channel material layers 112A-112C. More specifically, inclusion of uppermost sacrificial material layer 311D over bilayers 108 has been found to improve the matching of uppermost channel material layer 112C with the underlying channel material layers 112A-112B.

Channel material layers 112A-112C may each have any composition suitable for a channel of a field effect transistor (FET). In some examples, channel material layers 112A-112C are all substantially pure silicon. In other embodiments, channel material layers 112A-112C comprises germanium (e.g., $Si_{1-x}Ge_X$, $Ge_{1-x}$Snx, or substantially pure Ge). Channel material layers 112A-112C are all advantageously crystalline, and advantageously substantially monocrystalline. For example, where channel material layers 112A-112C are all substantially pure Si, Ge, or an alloy thereof, the crystallinity of channel material layers 112A-112C is cubic with a top surface of channel material stack 310 having crystallographic orientation of (100), (111), or (110). Other crystallographic orientations are also possible.

Sacrificial material layers 311A-311D have a different composition than channel material layers 112A-112C. In some examples, sacrificial material layers 311A-311D have more germanium than channel material layers 112A-112C. For example, where channel material layers 112A-112C are all predominantly silicon, sacrificial material layers 311A-311D are all $Si_{1-x}Ge_X$. The faction X may vary with some examples being between 0.3-0.35. In other embodiments where channel material layers 112A-112C comprise Ge, sacrificial material layers 311A-311D all have less Ge than channel material layers 112A-112C. For example, where channel material layers 112A-112C are each $Si_{1-x}Ge_X$ or GeSn, sacrificial material layers 311A-311D may all be predominantly silicon. Although Group IV superlattice bilayers are exemplary embodiments, channel material stack 310 and may instead comprise Group III-V, Group III-N, or any other semiconductor material system suitable for similar channel material-sacrificial material superlattice structures.

Mask material 180 may have any composition known to be suitable as a hardmask for patterning channel material stack 310. In some examples, mask material 180 is a dielectric material, such as, but not limited to silicon oxide (SiO), silicon nitride (SiN), silicon oxynitride, (SiON). Mask material 180 may comprise one or more material layers.

Returning to FIG. 2, methods 201 continue at block 230 where the fin line formed at block 220 is patterned with a gate line to define a transistor channel region. The gate line may be defined with a second lithographic patterning process to be substantially orthogonal to the fin line. A gate spacer material may then be formed adjacent to sidewalls of the gate line. The gate spacer material may have any suitable composition, with example dielectric compositions including SiO, nitride SiN, or SiON. At block 240 source and drain material is formed at portions of the fin line external to an outer sidewall of the gate spacer material. In some examples, sacrificial material layers are removed selectively from adjacent channel material layers, for example with a chemical etch process. Another gate spacer material is deposited to fill cavities in the sidewall of the channel material stack within the gate line that were created by removing the sacrificial material layers. This second gate spacer material, or gate cavity spacer, may again have any suitable composition with some exemplary dielectric composition being SiO, nitride SiN, or SiON. Source and drain material may then be formed adjacent to the outer sidewalls of the gate spacer materials.

Figure 3B:
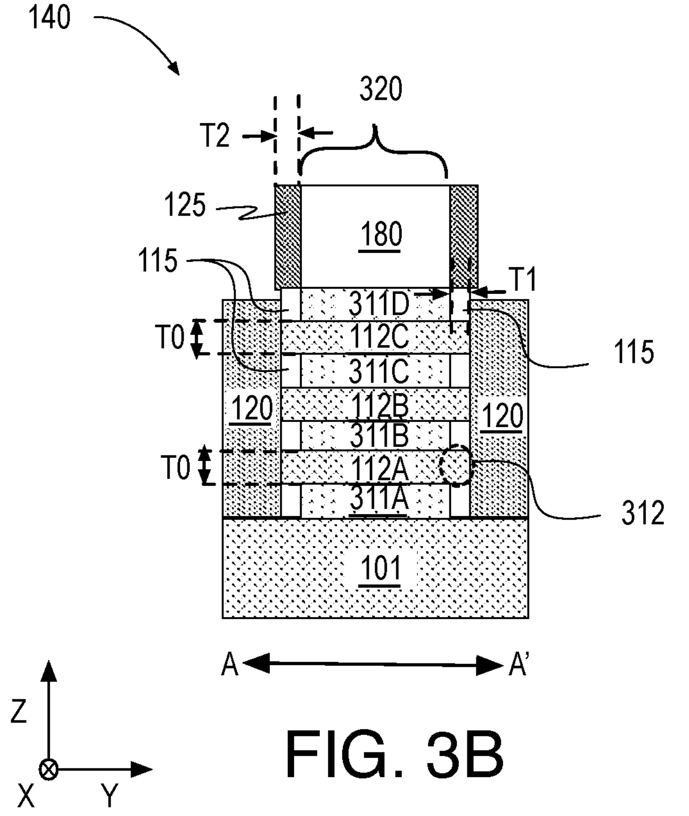

In the example shown in FIG. 3B, mask material 180 has been patterned according to a gate line 320 extending laterally over a longitudinal length (e.g., coincident with the x-axis). A transverse width of gate line 320 (e.g., coincident with the y-axis) is over an underlying length of channel material layers 112A-112C and sacrificial material layers 311A-311D. Adjacent to a sidewall of gate line 320 is gate cavity spacer material 115 and gate spacer material 125.

Gate cavity spacer material 115 has a sidewall thickness T1, which in some exemplary embodiments is different than a sidewall thickness T2 of gate spacer material 125. In some examples, thickness T1 may be 1-2 nm less than thickness T2. Chemical composition of gate cavity spacer material 115 is advantageously different than the composition of gate spacer material 125. In some exemplary embodiments, gate cavity spacer material 115 has more nitrogen than gate spacer material 125. As such, gate spacer material 125 may have a lower relative permittivity (i.e., dielectric constant) than gate cavity spacer material 115.

Notably, in the presence of uppermost sacrificial material layer 311D, gate cavity spacer material 115 is over uppermost channel material layer 112C. Instead of gate spacer material 125 being in contact with the top interface of uppermost channel material layers 112C, gate cavity spacer material 115 is between gate spacer material 125 and the top interface of uppermost channel material layer 112C. Hence, gate cavity spacer material 115 is advantageously both above and below each and all of channel material layers 112A-112C. In other words, along thickness T1, gate cavity spacer material 115 is in direct contact with each of a top and bottom interface of every one of channel material layers 112A-112C.

Source and drain material 120 is in contact with opposite ends of channel material layers 112A-112C. A high concentration of p-type or n-type impurities may be advantageously introduced and activated in source and drain material 120. Such activation may entail one or more thermal processes (e.g., exceeding 500° C.), such as epitaxial growth and/or thermal anneal.

Returning to FIG. 2, methods 201 continue at block 250 where sacrificial material is removed from within the gate line in preparation for forming a gate stack around the channel region of the retained channel material layers inside of the gate spacer material(s). While the sacrificial material may be removed selectively with substantially the same process(es) previously practiced in the formation of the source and drain material, the interface between sacrificial material and the channel material layers may have since become more diffuse during thermal processes associated with forming the source and drain material. Accordingly, channel material layers may lose some of their as-deposited thickness when sacrificial material is removed. Embodiments herein ensure any such effect is uniform between both an uppermost channel material layers and any underlying channel material layers.

Figure 3C:
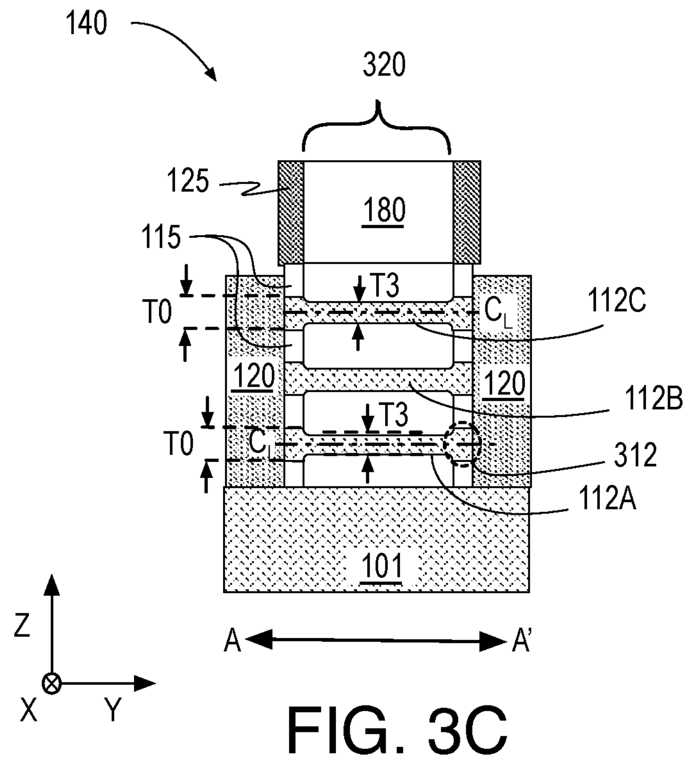

In the example illustrated in FIG. 3C, following an etch selective to sacrificial material, channel material layers 112A-112C have a cross-sectional thickness that necks down from thickness TO within end portions 312 proximal to gate cavity spacer material 115 to thickness T3 within the channel portion. This necking, for example may be the result of a Ge-selective etch removing some thickness of a silicon channel material layer into which Ge from the sacrificial layer has diffused. As illustrated for channel material layer 112A, the necking is symmetrical about a centerline (CL) passing through the midpoint of thickness TO. A centerline through thickness T3 is therefore substantially co-planar with the centerline through thickness TO. Notably, necking of uppermost channel material layer 112C is also symmetrical about a centerline (CL) passing through the midpoint of thickness TO.

Hence, removal of an uppermost sacrificial material ensures uppermost channel material layers 112C has substantially the same thickness profile as that of channel material layers 112A-112B. In absence of an uppermost sacrificial material, uppermost channel material layer 112C would instead have an asymmetrically necked thickness profile with a reduction in thickness occurring only at the bottom surface. Uniformity of the channel material layers 112A-112C would then suffer relative to the exemplary embodiment depicted in FIG. 3C.

Methods 201 (FIG. 2) continue at block 260 where a gate stack including a gate insulator and a gate electrode material is formed around the channel portion of the channel material layers. Any suitable gate insulator and gate electrode materials may be formed over one or more surfaces of the channel material. In advantageous embodiments, the gate stack is formed at least adjacent to a sidewall of the channel material layers, and advantageously wrapped around an entirety of each wire or ribbon of channel material A gate insulator within the gate stack may have any composition suitable for the channel material composition.

Figure 3D:
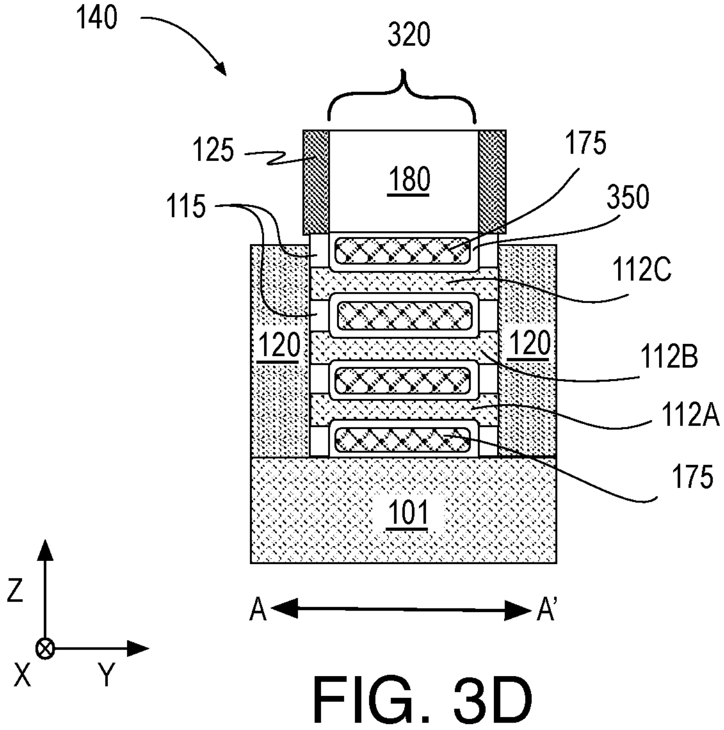

In the example illustrated in FIG. 3D, gate electrode material 175 and gate insulator 350 is occupying a region between adjacent gate spacer materials 115, 125. As shown, gate electrode material 175 backfills channel regions where sacrificial material has been removed from both below and over each channel material layers 112A-112C. In exemplary embodiments, gate insulator 350 is a high-k dielectric material (e.g., ε>9) including oxygen and one or more metals. As noted above, gate electrode material 175 may include a work function metal and a fill metal.

Returning to FIG. 2, methods 201 end at output 270 where the transistor structure is completed, and interconnect metallization levels are fabricated to interconnect a plurality of such transistor structures into functional integrated circuitry. For example, the gate stack may be further patterned with a "gate-cut" mask that defines a width of the gate stack in a direction substantially parallel to the fin line. One or more dielectric materials may also be deposited over the transistor structure, and contact metallization formed to each of the gate, source and drain terminals of the transistor structure, for example according to any known techniques.

Figure 4:
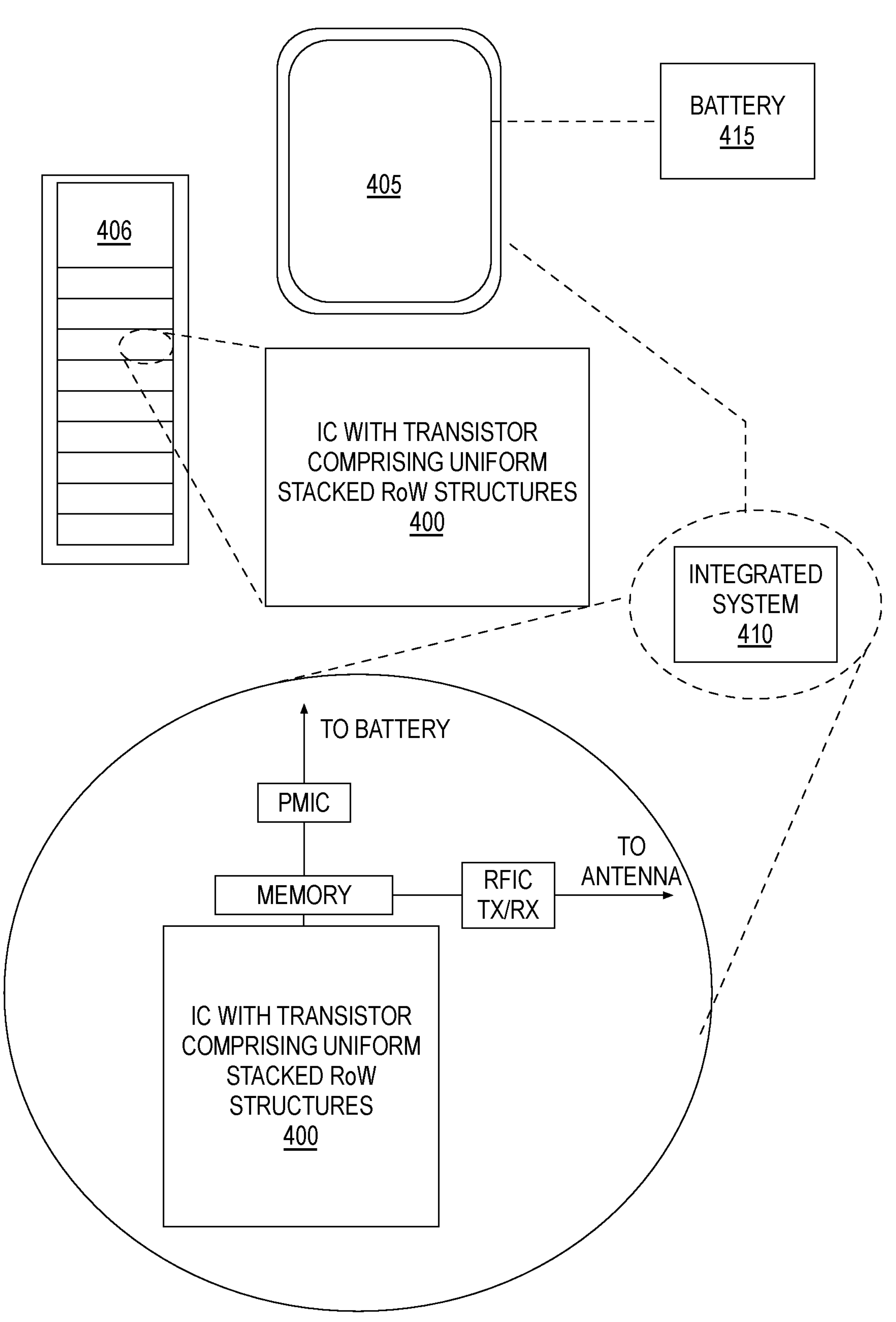
FIG. 4 illustrates a mobile computing platform and a data server machine employing an IC device with transistor structures that include a uniform stack of channel material layers, in accordance with some embodiments.

The transistor structures described above may be employed in a wide range of IC devices and further integrated in a wide range of computer-based applications. FIG. 4 illustrates a mobile computing platform 405 and a server machine 406 employing a packaged IC die including transistor structures with a stack of uniform channel material layers, for example as described elsewhere herein. Server machine 406 may be any commercial server, for example including any number of high-performance computing platforms disposed within a rack and networked together for electronic data processing, which in the exemplary embodiment includes a packaged IC die comprising a fin-symmetrical gate, for example as described elsewhere herein.

The mobile computing platform 405 may be any portable device configured for each of electronic data display, electronic data processing, wireless electronic data transmission, or the like. For example, the mobile computing platform 405 may be any of a tablet, a smart phone, laptop computer, etc., and may include a display screen (e.g., a capacitive, inductive, resistive, or optical touchscreen), an integrated system 410, and a battery 415.

As illustrated in the expanded view, one or more of a power management integrated circuit (PMIC) or RF (wireless) integrated circuit (RFIC) including a wideband RF (wireless) transmitter and/or receiver may be further coupled to IC 400. A PMIC may perform battery power regulation, DC-to-DC conversion, etc., and so has an input coupled to battery 415 and an output providing a current supply to other functional modules. An RFIC may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G and beyond.

Figure 5:
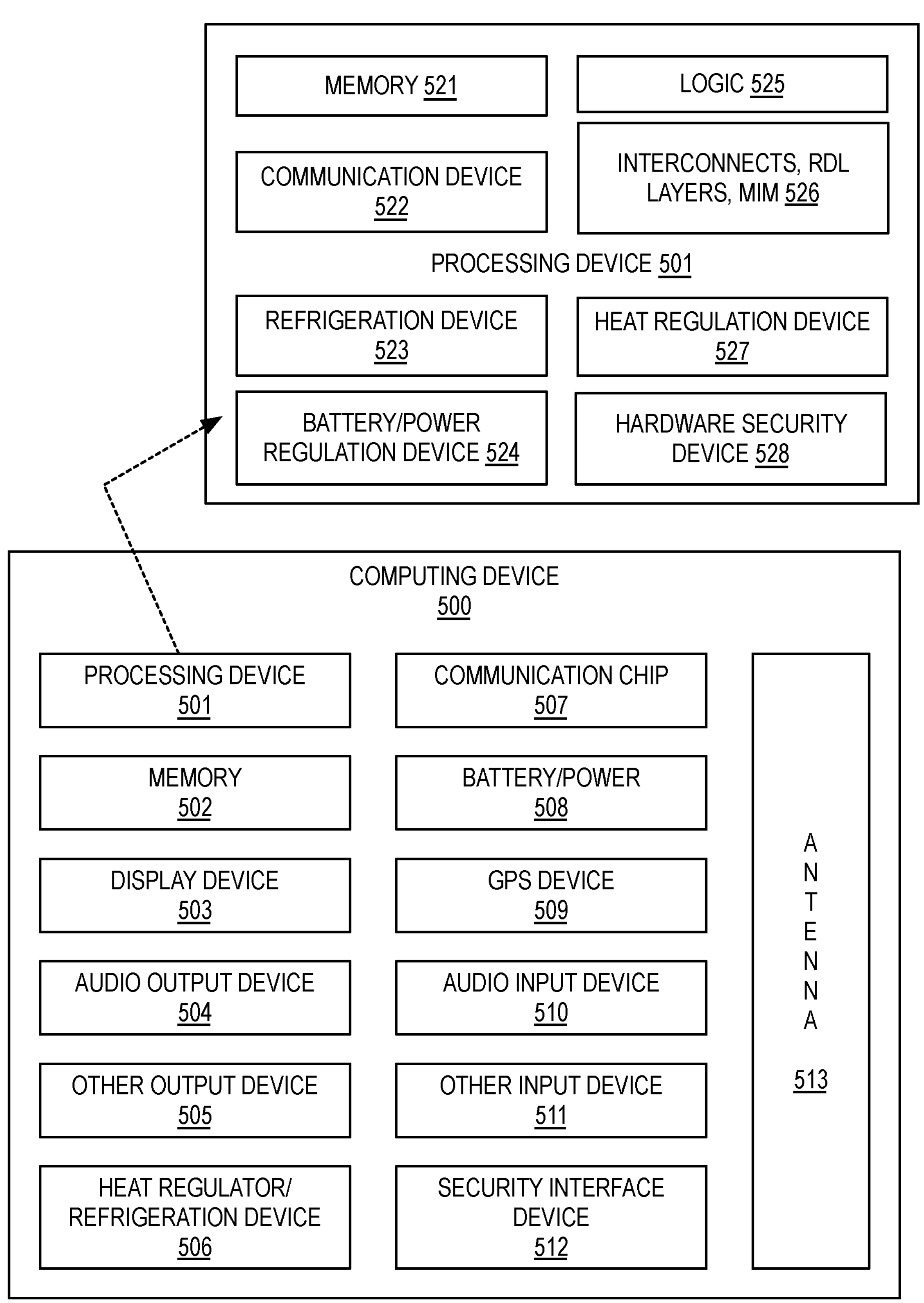
FIG. 5 is a functional block diagram of an electronic computing device, in accordance with some embodiments.

FIG. 5 is a block diagram of a cryogenically cooled computing device 500 in accordance with some embodiments. For example, one or more components of computing device 500 may include transistor structures with a stack of uniform channel material layers, for example as discussed elsewhere herein. A number of components are illustrated in FIG. 5 as included in computing device 500, but any one or more of these components may be omitted or duplicated, as suitable for the application. In some embodiments, some or all of the components included in computing device 500 may be attached to one or more printed circuit boards (e.g., a motherboard). In some embodiments, various ones of these components may be fabricated onto a single system-on-a-chip (SoC) die. Additionally, in various embodiments, computing device 500 may not include one or more of the components illustrated in FIG. 5, but computing device 500 may include interface circuitry for coupling to the one or more components. For example, computing device 500 may not include a display device 503, but may include display device interface circuitry (e.g., a connector and driver circuitry) to which display device 503 may be coupled.

Computing device 500 may include a processing device 501 (e.g., one or more processing devices). As used herein, the term processing device or processor indicates a device that processes electronic data from registers and/or memory to transform that electronic data into other electronic data that may be stored in registers and/or memory. Processing device 501 may include a memory 521, a communication device 522, a refrigeration/active cooling device 523, a battery/power regulation device 524, logic 525, interconnects 526 (i.e., optionally including redistribution layers (RDL) or metal-insulator-metal (MIM) devices), a heat regulation device 527, and a hardware security device 528.

Processing device 501 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 501 may include a memory 502, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 521 includes memory that shares a die with processing device 501. This memory may be used as cache memory and may include embedded dynamic random-access memory (eDRAM) or spin transfer torque magnetic random-access memory (STT-M RAM).

Computing device 500 may include a heat regulation/refrigeration device 506. Heat regulation/refrigeration device 506 may maintain processing device 501 (and/or other components of computing device 500) at a predetermined low temperature during operation. This predetermined low temperature may be any temperature discussed elsewhere herein.

In some embodiments, computing device 500 may include a communication chip 507 (e.g., one or more communication chips). For example, the communication chip 507 may be configured for managing wireless communications for the transfer of data to and from computing device 500. The term "wireless" and its derivatives may be used to describe circuits, devices, systems, methods, techniques, communications channels, etc., that may communicate data through the use of modulated electromagnetic radiation through a nonsolid medium.

Communication chip 507 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 507 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 507 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 507 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 507 may operate in accordance with other wireless protocols in other embodiments. Computing device 500 may include an antenna 513 to facilitate wireless communications and/or to receive other wireless communications (such as AM or FM radio transmissions).

In some embodiments, communication chip 507 may manage wired communications, such as electrical, optical, or any other suitable communication protocols (e.g., the Ethernet). As noted above, communication chip 507 may include multiple communication chips. For instance, a first communication chip 507 may be dedicated to shorter-range wireless communications such as Wi-Fi or Bluetooth, and a second communication chip 507 may be dedicated to longer-range wireless communications such as GPS, EDGE, GPRS, CDMA, WiMAX, LTE, EV-DO, or others. In some embodiments, a first communication chip 507 may be dedicated to wireless communications, and a second communication chip 507 may be dedicated to wired communications.

Computing device 500 may include battery/power circuitry 508. Battery/power circuitry 508 may include one or more energy storage devices (e.g., batteries or capacitors) and/or circuitry for coupling components of computing device 500 to an energy source separate from computing device 500 (e.g., AC line power).

Computing device 500 may include a display device 503 (or corresponding interface circuitry, as discussed above). Display device 503 may include any visual indicators, such as a heads-up display, a computer monitor, a projector, a touchscreen display, a liquid crystal display (LCD), a light-emitting diode display, or a flat panel display, for example.

Computing device 500 may include an audio output device 504 (or corresponding interface circuitry, as discussed above). Audio output device 504 may include any device that generates an audible indicator, such as speakers, headsets, or earbuds, for example.

Computing device 500 may include an audio input device 510 (or corresponding interface circuitry, as discussed above). Audio input device 510 may include any device that generates a signal representative of a sound, such as microphones, microphone arrays, or digital instruments (e.g., instruments having a musical instrument digital interface (MIDI) output).

Computing device 500 may include a global positioning system (GPS) device 509 (or corresponding interface circuitry, as discussed above). GPS device 509 may be in communication with a satellite-based system and may receive a location of computing device 500, as known in the art.

Computing device 500 may include another output device 505 (or corresponding interface circuitry, as discussed above). Examples include an audio codec, a video codec, a printer, a wired or wireless transmitter for providing information to other devices, or an additional storage device.

Computing device 500 may include another input device 511 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 500 may include a security interface device 512. Security interface device 512 may include any device that provides security measures for computing device 500 such as intrusion detection, biometric validation, security encode or decode, managing access lists, malware detection, or spyware detection. In some examples, security interface device 512 comprises OTP ROM further including a via MIM fuse, for example as described elsewhere herein.

Computing device 500, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the disclosure is not limited to the embodiments so described, but instead can be practiced with modification and alteration without departing from the scope of the appended claims. For example, the above embodiments may include specific combinations of features as further provided below.

In first examples, an apparatus comprises a stack of channel material layers comprising an uppermost channel material layer of a transistor structure, and at least a second channel material layer below the uppermost channel material layer. The apparatus comprises a gate electrode material above, below, and adjacent to a sidewall of a first portion of the uppermost channel material layer and a first portion of the second channel material layer. The apparatus comprises a source material or a drain material coupled to a second portion of the uppermost channel material layer and to a second portion of the second channel material layer. A first gate spacer is above and below the second portion of the uppermost channel material layer and above and below the second portion of the second channel material layer. A second gate spacer is adjacent to a sidewall of the second portion of the uppermost channel material layer and adjacent to a sidewall of the second portion of the second channel material layer.

In second examples, for any of the first examples the stack of channel material layers consists of n channel material layers, and wherein the first gate spacer is above and below the second portion of each one of the n channel material layers.

In third examples, for any of the first through second examples a mask material is over the gate electrode material and a portion of the second gate spacer is adjacent to a sidewall of the mask material and in direct contact with an underlying portion of the first gate spacer.

In fourth examples, for any of the first through third examples the first gate spacer has a first composition and the second gate spacer has a second composition, different than the first composition.

In fifth examples, for any of the fourth examples the first composition has more nitrogen than the second composition.

In sixth examples, for any of first through fifth examples the first portion of the uppermost channel material layer has a first thickness and wherein the second portion of the uppermost channel material layer has a second thickness, larger than the first thickness.

In seventh examples for any of the sixth examples, wherein the first portion of the second channel material layer has the first thickness and the second portion of the second channel material layer has the second thickness.

In eighth examples, for any of the sixth through seventh examples a centerline of the first thickness is coplanar with a centerline of the second thickness.

In ninth examples, for any of the sixth through eighth examples the first thickness is at least 1 nm smaller than the second thickness.

In tenth examples, an apparatus comprises a stack of channel material layers comprising an uppermost channel material layer of a transistor structure, and at least a second channel material layer below the uppermost channel material layer. The apparatus comprises a gate electrode material above, below, and adjacent to a sidewall of a channel portion of the uppermost channel material layer and a channel portion of the second channel material layer. The apparatus comprises a source material or a drain material coupled to an end portion of the uppermost channel material layer and to an end portion of the second channel material layer. The channel portion of the uppermost channel material layer has a first thickness and the end portion of the uppermost channel material layer has a second thickness, larger than the first thickness. The channel portion of the second channel material layer has the first thickness and the end portion of the second channel material layer has the second thickness.

In eleventh examples, for any of the tenth examples a centerline of the first thickness is substantially coplanar with a centerline of the second thickness.

In twelfth examples, for any of the tenth through eleventh examples the first thickness is at least 1 nm smaller than the second thickness.

In thirteenth examples, for any of the tenth through twelfth examples the apparatus comprises a first gate spacer above and below the end portion of the uppermost channel material layer and above and below the end portion of the second channel material layer. A second gate spacer is adjacent to a sidewall of the end portion of the uppermost channel material layer and is adjacent to a sidewall of the end portion of the second channel material layer.

In fourteenth examples, for any of the thirteenth examples the stack of channel material layers consists of n channel material layers, and the first gate spacer is above and below the end portion of each one of the n channel material layers.

In fifteenth examples, for any of the thirteenth through fourteenth examples the first gate spacer has a first composition and the second gate spacer has a second composition, different than the first composition.

In sixteenth examples, for any of the fifteenth examples the first composition has more nitrogen than the second composition.

In seventeenth examples, for any of the tenth through fifteenth examples the transistor structure is within an IC die and the apparatus further comprises a power supply coupled to the IC die.

In eighteenth examples, a method comprises forming a substantially crystalline fin comprising a bilayer under an uppermost sacrificial material layer. The bilayer comprises a channel material layer and a second sacrificial material layer. The method comprises removing the uppermost sacrificial material layer and the second sacrificial material layer. The method comprises forming a gate electrode material around a channel portion of the channel material layer. The method comprises forming a source material and a drain material coupled to an end portion of the channel material layer.

In nineteenth examples, for any of the eighteenth examples forming the source material and the drain material comprises forming a first gate spacer, removing a first portion of the uppermost sacrificial material layer and a first portion the second sacrificial material layer, forming a second gate spacer adjacent to the first gate spacer and covering an end of a second portion of the uppermost sacrificial material layer and an end of a second portion of the second sacrificial material layer, forming a source material and a drain material in contact with an end portion of the channel material layer and in contact with a sidewall of the second gate spacer.

In twentieth examples, for any of the nineteenth examples the method comprises forming the gate electrode material comprises exposing the channel portion by removing the second portion of the uppermost sacrificial material layer and the second portion of the second sacrificial material layer.

However, the above embodiments are not limited in this regard, and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:

a stack of channel material layers comprising an uppermost channel material layer of a transistor structure and at least a second channel material layer below the uppermost channel material layer;

a gate electrode material above, below, and adjacent to a sidewall of a first portion of the uppermost channel material layer and a first portion of the second channel material layer;

a source material or a drain material coupled to a second portion of the uppermost channel material layer and to a second portion of the second channel material layer;

a first gate spacer above and below the second portion of the uppermost channel material layer and above and below the second portion of the second channel material layer; and a second gate spacer adjacent to a sidewall of the second portion of the uppermost channel material layer and adjacent to a sidewall of the second portion of the second channel material layer, wherein the first portion of the uppermost channel material layer has a first thickness and wherein the second portion of the uppermost channel material layer has a second thickness, larger than the first thickness.

2. The apparatus of claim 1, wherein the stack of channel material layers consists of n channel material layers, and wherein the first gate spacer is above and below the second portion of each one of the n channel material layers.

3. The apparatus of claim 1, wherein a mask material is over the gate electrode material and a portion of the second gate spacer is adjacent to a sidewall of the mask material and in direct contact with an underlying portion of the first gate spacer.

4. The apparatus of claim 1, wherein the first gate spacer has a first composition and the second gate spacer has a second composition, different than the first composition.

5. The apparatus of claim 4, wherein the first composition has more nitrogen than the second composition.

6. The apparatus of claim 1, wherein the first portion of the second channel material layer has the first thickness and the second portion of the second channel material layer has the second thickness.

7. The apparatus of claim 1, wherein a centerline of the first thickness is coplanar with a centerline of the second thickness.

8. The apparatus of claim 1, wherein the first thickness is at least 1 nm smaller than the second thickness.

9. An apparatus, comprising:

a stack of channel material layers comprising an uppermost channel material layer of a transistor structure, and at least a second channel material layer below the uppermost channel material layer;

a gate electrode material above, below, and adjacent to a sidewall of a channel portion of the uppermost channel material layer and a channel portion of the second channel material layer; and a source material or a drain material coupled to an end portion of the uppermost channel material layer and to an end portion of the second channel material layer, wherein:

the channel portion of the uppermost channel material layer has a first thickness;

the end portion of the uppermost channel material layer has a second thickness, larger than the first thickness;

the channel portion of the second channel material layer has substantially the first thickness; and the end portion of the second channel material layer has substantially the second thickness.

10. The apparatus of claim 9, wherein a centerline of the first thickness is substantially coplanar with a centerline of the second thickness.

11. The apparatus of claim 9, wherein the first thickness is at least 1 nm smaller than the second thickness.

12. The apparatus of claim 9, further comprising:

a first gate spacer above and below the end portion of the uppermost channel material layer and above and below the end portion of the second channel material layer; and a second gate spacer adjacent to a sidewall of the end portion of the uppermost channel material layer and adjacent to a sidewall of the end portion of the second channel material layer.

13. The apparatus of claim 12, wherein the stack of channel material layers consists of n channel material layers, and wherein the first gate spacer is above and below the end portion of each one of the n channel material layers.

14. The apparatus of claim 13, wherein the first gate spacer has a first composition and the second gate spacer has a second composition, different than the first composition.

15. The apparatus of claim 14, wherein the first composition has more nitrogen than the second composition.

16. The apparatus of claim 9, wherein the transistor structure is within an IC die and the apparatus further comprises a power supply coupled to the IC die.

* * * * *